United States Patent [19]

Schiebel et al.

[11] Patent Number: 5,396,072
[45] Date of Patent: Mar. 7, 1995

[54] X-RAY IMAGE DETECTOR

[75] Inventors: Ulrich Schiebel; Herfried Wieczorek; Andreas Brauers, all of Aachen, Germany

[73] Assignee: U. S. Philips Corporation, New York, N.Y.

[21] Appl. No.: 107,548

[22] Filed: Aug. 17, 1993

[30] Foreign Application Priority Data

Aug. 17, 1992 [DE] Germany .................. 4227096.0

[51] Int. Cl.⁶ .................. G01T 1/24; G01N 23/04
[52] U.S. Cl. .................. 250/370.09; 250/580
[58] Field of Search .................. 250/580, 591, 370.09

[56] References Cited

U.S. PATENT DOCUMENTS

| | | | |
|---|---|---|---|
| 4,471,371 | 9/1984 | Hamano | 357/31 |
| 5,132,541 | 7/1992 | Conrads et al. | 250/370.01 |
| 5,166,524 | 11/1992 | Lee et al. | 250/580 |
| 5,168,160 | 12/1992 | Jeromin et al. | 250/580 |

FOREIGN PATENT DOCUMENTS 444720 1/1991 European Pat. Off. .
61-1177 1/1986 Japan .

*Primary Examiner*—Carolyn E. Fields
*Attorney, Agent, or Firm*—Jack D. Slobod

[57] ABSTRACT

The invention relates to an X-ray image detector, comprising a plurality of X-ray-sensitive sensors and having the following features:

each sensor comprises a collecting electrode and a switching element which connects the collecting electrode to an output lead;

a photoconductor layer is provided between the individual collecting electrodes and a bias electrode;

the collecting electrodes form, in conjuction with reference electrodes, capacitances which can be charged by charge carriers generated in the photoconductor. The invention improves the effectiveness of such an X-ray image detector in that either the surface area of the collecting electrodes is increased or the electric field is distorted by a semiconductor layer so that the majority of the charge carriers generated in the photoconductor flow to the collecting electrodes.

13 Claims, 7 Drawing Sheets

X-RAY IMAGE DETECTOR

BACKGROUND OF THE INVENTION

The invention relates to an X-ray image detector, comprising a plurality of X-ray sensitive sensors and having the following features:
- each sensor comprises a collecting electrode and a switching element which connects the collecting electrode to an output lead;
- a photoconductor layer is provided between the individual collecting electrodes and a bias electrode;
- in conjunction with reference electrodes, the collecting electrodes form capacitances which can be charged by charge carriers generated in the photoconductor.

X-ray image detectors of this kind are used inter alia for fluorosscopy where X-ray images are made in a close succession in time, for example 60 images/second. In particular, FIG. 1 shows a circuit diagram of an X-ray sensor matrix and FIG. 2 shows a thin-film structure of such an X-ray sensor matrix in a plan view (FIG. 2a) and a cross-sectional view (FIG. 2b). A circuit diagram of such an X-ray image detector being an X-ray sensor matrix which is known from EP-OS 444 720 is diagrammatically shown in FIG. 1. For each pixel there is provided a sensor which comprises a switching element 1, a capacitance 2 as well as a photosensor. The typically 2000×2000 switching elements are realized on a common dielectric substrate (glass) using a thin-film technique (for example, in the form of thin-film field effect transistors 1 as shown in FIG. 1). The photosensors are formed by a continuous photoconductor layer 3 covering the entire image area, a bias electrode 4 provided on the photoconductor layer, and for each pixel a separate collecting electrode 11 which is provided on the other side of the photoconductor layer. When the image detector is struck by X-rays in the operating condition, charge carriers are generated in the photoconductor layer 3, said charge carriers flowing through the photoconductor to the collecting electrodes 11 under the influence of an electric field generated by means of a bias source 40 connected to the bias electrode 4. The capacitances 2 connected to the collecting 11 electrodes are thus charged, the other electrode of said capacitance being connected to an electrode 10 carrying a reference potential.

The sensors are arranged in rows and columns as in a matrix, the spacing between the rows and the columns being the same. This spacing determines the spatial resolution. The gate electrodes of the thin-film field effect transistors constituting the switching elements are row-wise interconnected by means of a drive circuit 6 for the purpose of reading. To this end, the gate electrodes of all switching elements of a row are connected to a respective common switching lead 5. The source electrodes of the thin-film field effect transistors are connected to the respective, associated capacitance, whereas their drain electrodes are column-wise connected to a common output lead 7.

The FIGS. 2a and 2b are a plan view and a cross-sectional view, respectively, of a part of the X-ray image sensor matrix, wherefrom the photoconductor layer 3 and the bias electrode 4 have been omitted. Even though the representation is substantially simplified, it still shows the essential elements. On a substrate 15 there are provided a reference electrode 10 (preferably connected to ground potential) as well as the switching leads 5. The switching leads 5 comprise perpendicularly extending tappings 17 which form the gate electrodes of the thin-film field effect transistors. Above the gate electrode 17 there is provided a multilayer structure 12 consisting of semiconductor and insulating layers which constitutes, in conjunction with the electrodes 7 (drain) and 11 (source) a thin-film field effect transistor. The electrode 11 thus serves as the collecting electrode and the source electrode and also constitutes the storage capacitance 2 in conjunction with a reference electrode 10, covered by this electrode, and an intermediate dielectric.

In the thin-film arrangement shown in FIG. 2, the layers between the electrodes are very thin (of the order of magnitude of from 0.2–1 $\mu$m). Therefore, it is important that the collecting electrodes do not cover the switching leads, but notably not the output leads 7, because high parasitic capacitances would then be formed between the collecting electrode 11 and the relevant electrodes. In the case of the output leads 7, this would lead to capacitive signal coupling-out and hence to a reduction of the signal to be read, and also to increased noise of the output amplifier 8 connected to the output leads 7, because these amplifiers "see" a higher input capacitance. The collecting electrodes 11 on the one side and the leads 5, 7 on the other side, therefore, must be adjacently arranged, i.e. in the plan view of FIG. 2a the collecting electrodes may not overlap the leads 5 and 7. Thus, they must be restricted to the surface area remaining between two neighboring switching leads 5 or two neighboring output leads 7.

Because all leads 5, 7 and 10 should have a width of between 10 and 25 $\mu$m in order to achieve adequate conductivity, the portion of the overall surface area of an X-ray image detector which is occupied by the collecting electrode will be smaller than the pixels, or their spacing is smaller, i.e. as the resolution is higher.

SUMMARY OF THE INVENTION

It is an object of the present invention to provide an X-ray image detector which has a suitable sensitivity also in the case of a high spatial resolution, the capacitance of its construction at the same time being as low as possible.

On the basis of an X-ray image detector of the kind set forth, this object is achieved in accordance with the invention in that each of the collecting electrodes comprises two electrically contacting electrode portions, the first electrode portion being arranged in a respective area adjoining the associated output lead, the second electrode portion having a surface area which is greater than that of the first electrode portion and being situated between the first electrode portion and the bias electrode, an insulating layer being provided between the second electrode portion and the output lead.

As a result of the use of a collecting electrode consisting of two electrode portions, its functions are also split: in conjunction with one of the reference electrodes 10, the first electrode portion forms a capacitance and at the same time constitutes an electrode of the switching element, whereas the second electrode portion collects the charge carriers generated in the photoconductor layer. The restrictions imposed in respect of the first electrode portion are not applicable to the second electrode portion, i.e. the second electrode portion may at least partly overlap the leads, notably the output leads, so that a comparatively high sensitivity is achieved. The parasitic resultant capacitances between the second electrode portion and the leads remain small when an insulating layer of sufficient, thickness is used.

At this point reference is made to JP-OS 61-1177 or U.S. Pat. No. 4,471,371 which relate to a thin-film image detector for visible light. Image detectors for visible light are distinct from X-ray image detectors in that they comprise only a thin semiconductor layer instead of a comparatively thick photoconductor layer, which semiconductor layer consists of, for example amorphous silicon. As a result, a comparatively high capacitance is obtained so that no separate capacitance, such as the capacitance 2, is required. In the known image detectors the electrodes of the switching elements or the output lead are situated in a plane which is separated from the plane in which the collecting electrodes are situated by a thin-film insulating layer. As a result, very high parasitic capacitances occur between the electrodes of the switching element and the collecting electrode, which capacitances cannot be tolerated in an X-ray image detector which is to be read at a high image frequency.

A second solution to the problem in accordance with the invention, based on an X-ray image detector of the kind set forth, has the following characteristics:
- the collecting electrode is arranged adjacent the output lead;
- the switching element and the output lead are covered by an insulating layer;
- the insulating layer and the collecting electrode are covered by a semiconductor layer;
- the semiconductor layer is doped so that for the charge carriers flowing in the direction of the collecting electrode it has a conductivity which is high in comparison with its conductivity for charge carriers of opposite polarity.

According to this solution, space charges are formed above the semiconductor layer areas passivated by the insulating layer, which space charges distort the electric field in the photoconductor layer so that charge carriers which are not generated above the collecting electrodes contacting the semiconductor layer can also reach these electrodes. Despite comparatively small surface areas of the collecting electrodes, this solution also offers a high sensitivity. In a further version of this solution, between the semiconductor layer and the collecting electrodes there is provided an additional semiconductor layer which has a low conductivity for positive as well as negative charge carriers. The additional semiconductor layer serves to build up a space charge at the area adjacent the collecting electrodes. The space charge distorts the electric field so that the signal-producing charge carriers in the semiconductor layer situated thereabove, having a suitable conductivity for these carriers, are transported to the collecting electrode even when they have not been generated at the area above the collecting electrode.

In a further version of the invention which is suitable for both solutions, to both sides of the photoconductor layer there are provided layers which have a thickness which is small in comparison with that of the photoconductor layer and which are doped so that for their conductivity for the charge carriers flowing from the photoconductor to the neighboring electrodes is high in comparison with their conductivity for charge carriers of opposite polarity. The two layers to both sides of the photoconductor layer block charge carriers injected by the collecting electrodes or by the bias electrode, so that the dark discharge rates are reduced. In a further embodiment, between the bias electrode and its neighboring layer there is provided a layer which is made of the same material as the photoconductor layer but which is substantially thinner than the latter layer. As a result, the dark discharge rates are even more drastically reduced.

BRIEF DESCRIPTION OF THE DRAWINGS

The invention will be described in detail hereinafter with reference to the remaining drawings. Therein.

DETAILED DESCRIPTION

Figure 1:
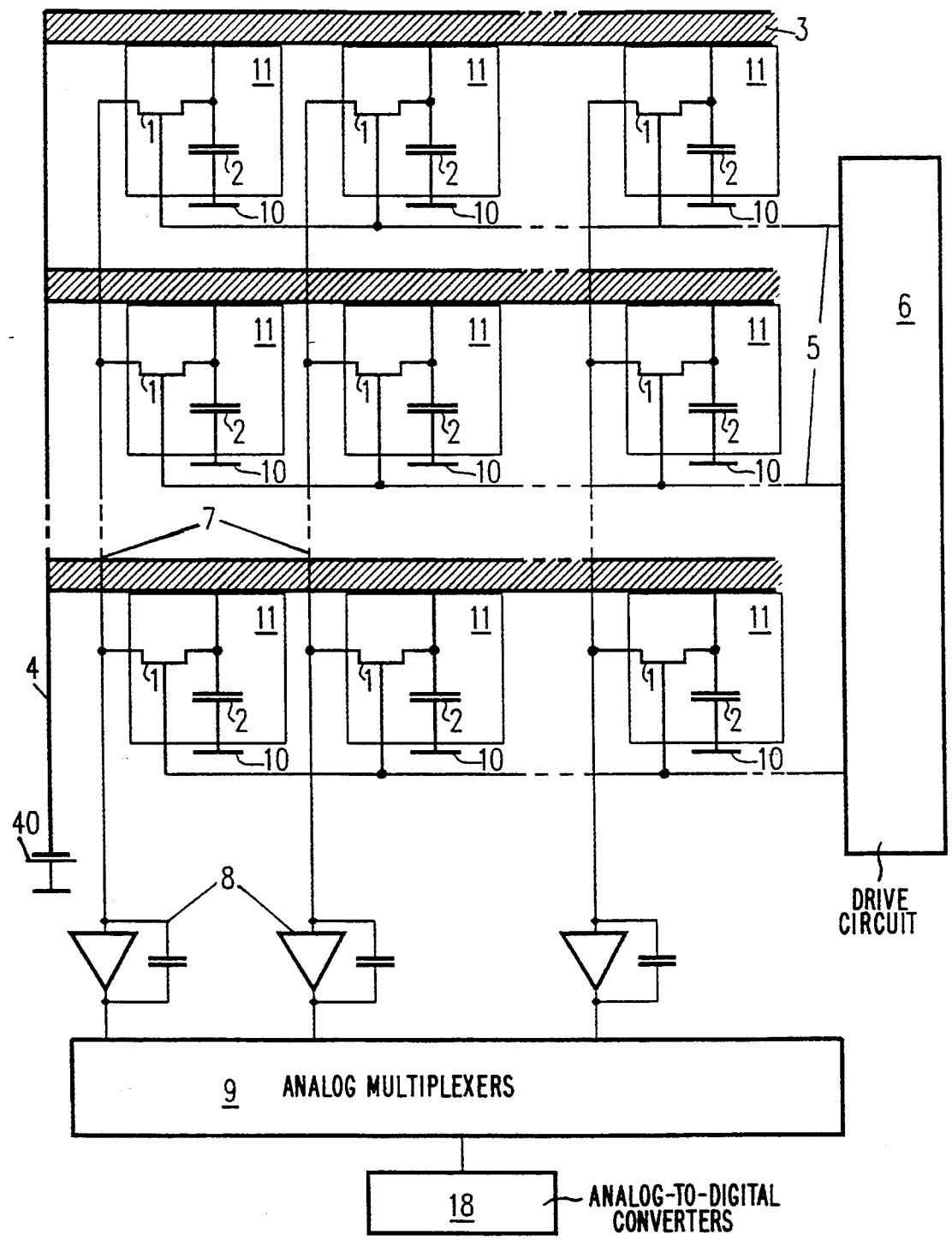
FIG. 1 shows a circuit diagram of a prior art X-ray sensor matrix.
Figure 2A:
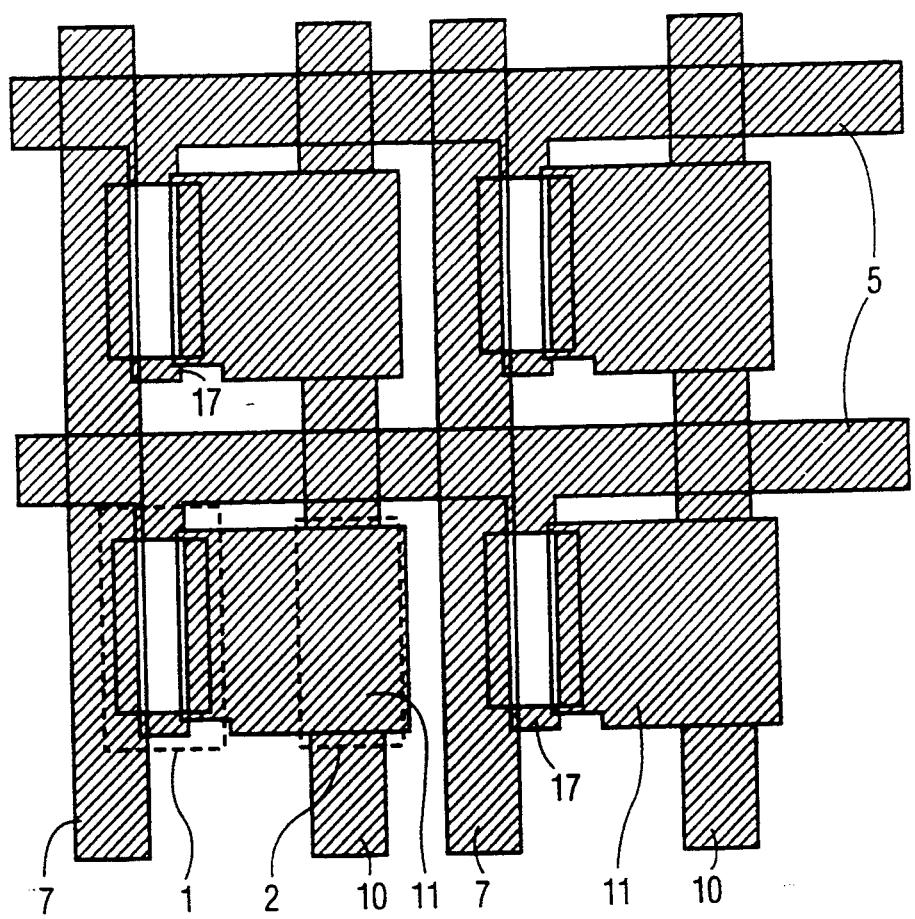
FIG. 2 shows the FIG. 1 X-ray sensor matrix in a plan view (FIG. 2a) and a cross-sectional view (FIG. 2b).
Figure 2B:
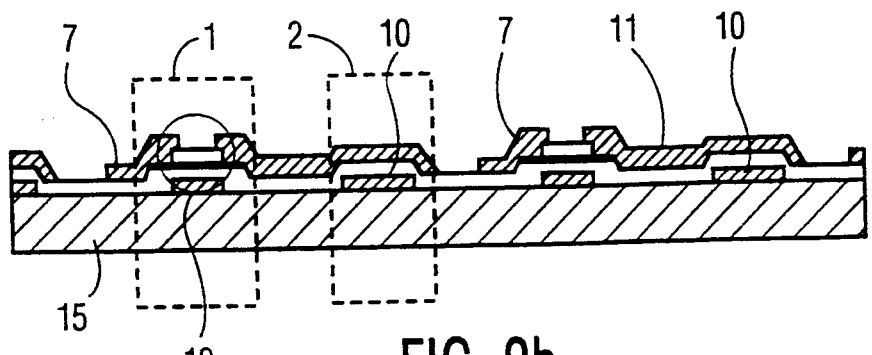
Figure 3A:
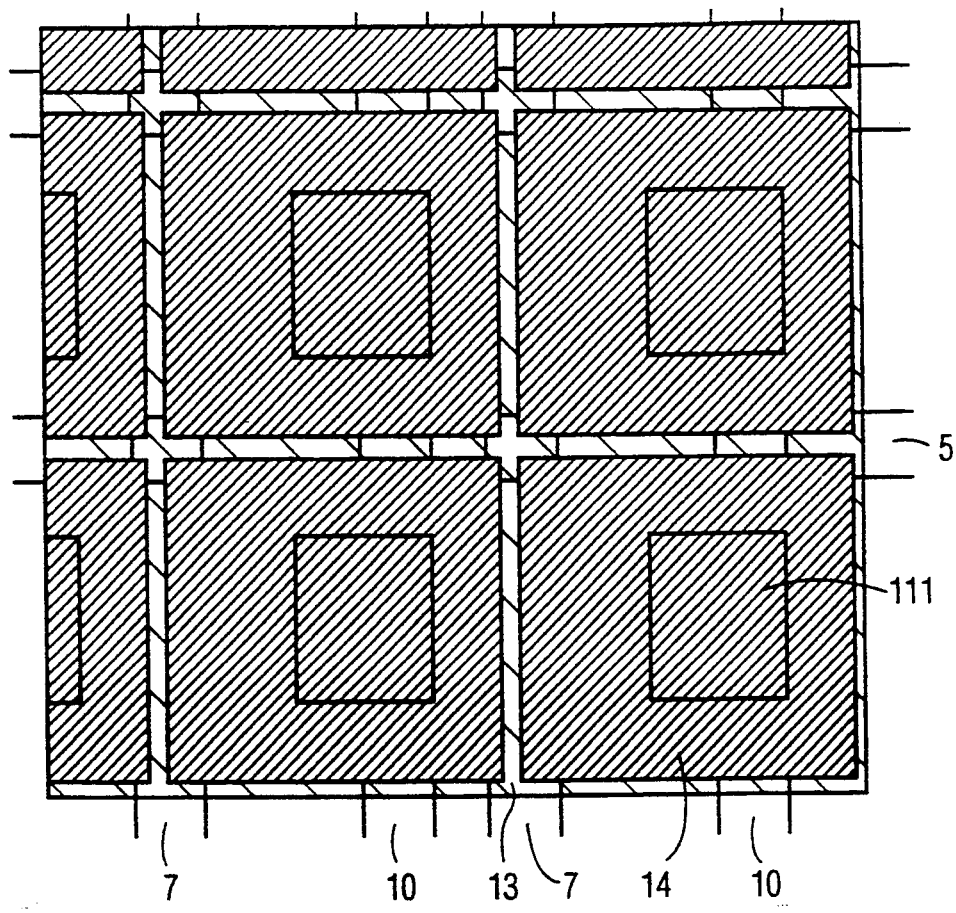
FIG. 3 shows a first embodiment of a detector in accordance with the invention in a plan view (FIG. 3a) and a cross-sectional view (FIG. 3b).
Figure 3B:
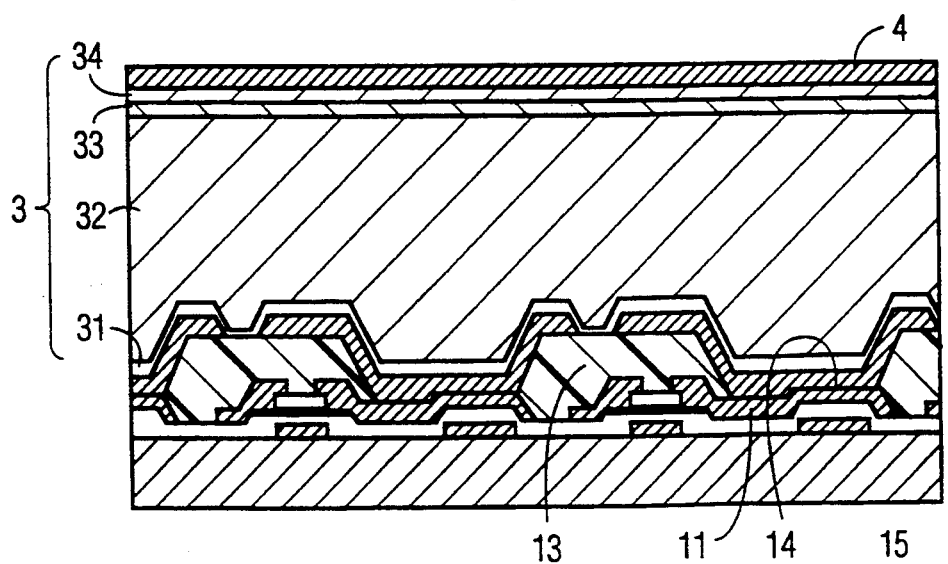

In the plan view and the cross-sectional view of an X-ray image detector embodiment in FIG. 3, for corresponding parts the same references are used for corresponding parts as in FIG. 2. The cross-sectional view of FIG. 3b is not to scale and the thickness ratio of the individual layers does not correspond to the actual ratio to be described hereinafter. On the thin-film structure shown in FIG. 2 there is first provided an insulating layer 13 having a flat surface. In this surface, contact holes are formed above the collecting electrodes 11 by means of a photolithographic method, which contact holes extend as far as the electrodes 11.

Subsequently, there is provided a metallic layer, for example by deposition from the vapor phase. This through-layer of preferably aluminium is structured by means of a photolithographic method so that electrodes 14 having an as large as possible surface area are formed for the individual pixels, which electrodes cover the surface area available to each pixel as much as possible and electrically contact, via the contact holes, the electrodes 11 situated therebelow. The distance between the facing sides of neighboring collecting electrodes may then be between 5 and 15 $\mu$m, so that the ratio of the collecting electrode surface area to the surface area available to a pixel can be as high as 90%, even for a pixel size of 100 $\mu$m. Thus, the electrodes 14 can collect a pan of the charge carriers generated in the photoconductor which is substantially larger than that collected by the electrodes 11, resulting in improved sensitivity.

For these dimensions of the electrodes 14, covering the electrodes 11 on all sides, it is inevitable that they (at least partly) cover also the read leads and the control leads, thus giving rise to additional parasitic capacitances between the electrode 11 and the leads 7 and 5. In order to minimize these parasitic capacitances, the insulating layer 13 should have a thickness of at least 3

μm, preferably from 5 to 10 μm. In this respect a relative dielectric constant of from 4 to 5 is assumed (for a higher dielectric constant, the insulating layer must even be thicker). Suitable materials in this respect are silicon oxide, silicon nitride or polyimide.

Figure 4:
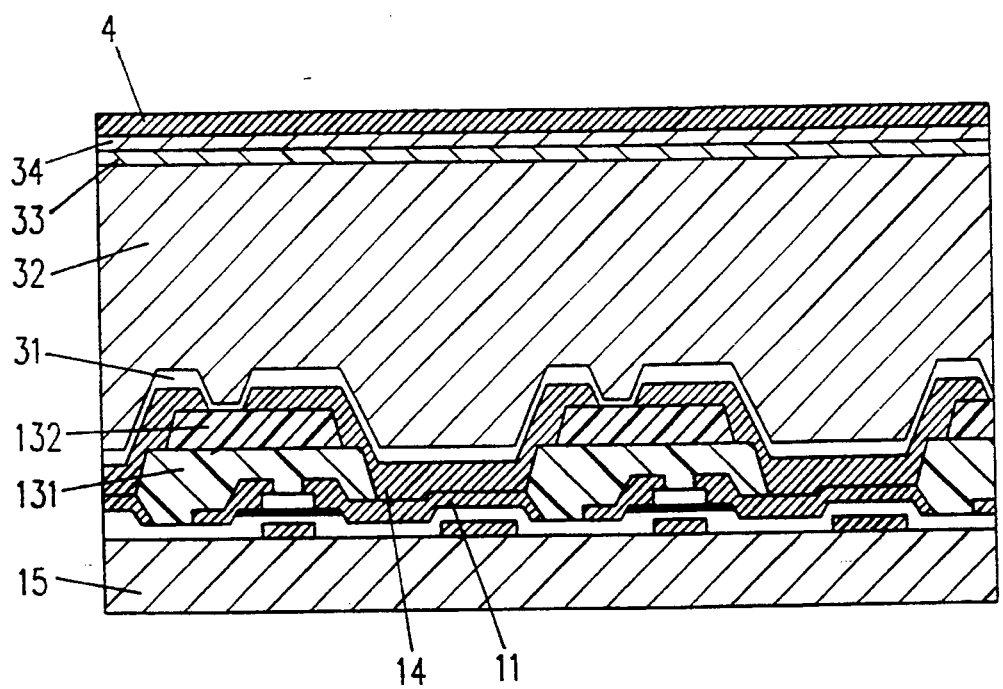
FIG. 4 is a cross-sectional view of an improved embodiment of such a detector.

In order to achieve these comparatively large layer thicknesses, the insulating layer is preferably deposited in the form of a plurality of thin, separate layers. This is shown in FIG. 4, in which the insulating layer is formed by the sub-layers 131 and 132. The contact holes provided for the contacting of the electrode portions 11 and 14 preferably are proportioned so that their width increases in the direction from the bottom upwards, thus forming in steps which ensure suitable metallization by the layer 14. It may be advantageous to use different materials for the various sub-layers (for example, the layer 131 may consist of silicon oxide and the layer 132 of polyimide). When the etching process required for forming the contact holes utilizes etching agents which attack each time only one of the sub-layers, it is thus readily possible to stop the etching process at a defined depth for the individual layers.

On the structure obtained after deposition of the electrodes 14 the actual photoconductor layer 3 is provided. The photoconductor layer 3 is finally provided with a metallic cover electrode 4 of gold or aluminium. It may be advantageous to construct the photoconductor as a multilayer structure as follows.

First there is provided a semiconductor layer 31 which is substantially not conductive for negative charge carriers, but conducts positive charge carriers so much the better. This layer may consist of various materials, for example $HgI_2$, CdSe, CdTe, PbO or Se, whose conductivity is adjusted in the above sense by given additions. This is obtained, for example by means of a selenium layer having a thickness between 1 and 5 μm, doped with from 20 to 200 ppm Cl. Thereon the actual photoconductor layer 32 of amorphous selenium with an addition of from 0.1 to 1% arsenic is deposited. This layer must have a thickness of between 200 and 800 μm so as to achieve adequate absorption of the X-ray quanta occurring during a medical examination. On the layer 32 there is provided a semiconductor layer 33 which is doped, so that it does not conduct positive charge carriers, i.e. holes, but conducts the negative charge carriers (electrons) so much the better. This layer may consist of, for example selenium doped with from 20 to 200 ppm alkali metal (Li, Na, K, Cs) and has a thickness of between 0.5 and 2 μm.

During operation of the image detector a positive voltage of between 1 and 10 kV is applied to the bias electrode 4. The semiconductor layers 31 and 33 should then block charge carriers injected by the collecting electrodes 14 or the cover electrode 4, so that the dark discharge rates are distinctly reduced. Surprisingly, however, this function is performed satisfactorily only if a thin semiconductor layer 34 is provided between the doped layer 33 and the bias electrode 4 of gold or aluminium, which thin semiconductor layer has a low conductivity for negative and positive charge carriers, for example a selenium layer doped with arsenic in the same way as the actual photoconductor layer 32. When the layer 32 has a thickness of 0.3 mm, a voltage of up to 5 kV can then be applied to the bias electrode without giving rise to significant dark currents (with a density of more than 1 $pA/cm^2$).

An X-ray image is read by means of such an X-ray image detector in the same way as described in EP-OS 444 720. Before the X-rays are switched on, the switching elements 1 are closed (conductive), so that the capacitances 2 cannot be charged. The X-ray exposure can take place with an image frequency of, for example 60 images/second, the dose for the images then being between 10 NGy and 50 NGy.

During the X-ray exposure, the switches 1 are normally open. For the reading of the X-ray image all switching elements of a single line are each time simultaneously closed for a brief period of time (from 10 to 20 μs) by application of a corresponding potential to the associated switching lead 5. During this period the charges collected from the capacitances 2 flow to the inputs of the amplifiers 8 via the output leads 7. The amplifiers are connected as current integrators so that their output signal corresponds to the full charge emanating from the capacitor. The collecting electrodes 11, 14 are then maintained virtually at ground potential. The output signals of the amplifiers are taken up by an analog multiplexer 9 which converts the parallel signals into a serial signal current of correspondingly higher bandwidth. The entire process is then repeated for the next image line and subsequently for all other image lines.

At present the amplifiers 8 cannot be realized with sufficient sensitivity and noise quality in thin-film technique. Therefore, they must be situated outside the thin-film substrate and be constructed using a conventional integrated circuit technique. In these circumstances each time from approximately 32 to 256 amplifiers and the associated analog multiplexer can be integrated on a chip. Thus, for the total number of 2000 image columns there would be required between 8 and 64 chips, whose inputs would have to be connected to the output leads present on the thin-film substrate. The outputs of the analog multiplexers 9 are connected to analog-to-digital converters 18, after which the digital data is further processed.

Figure 5A:
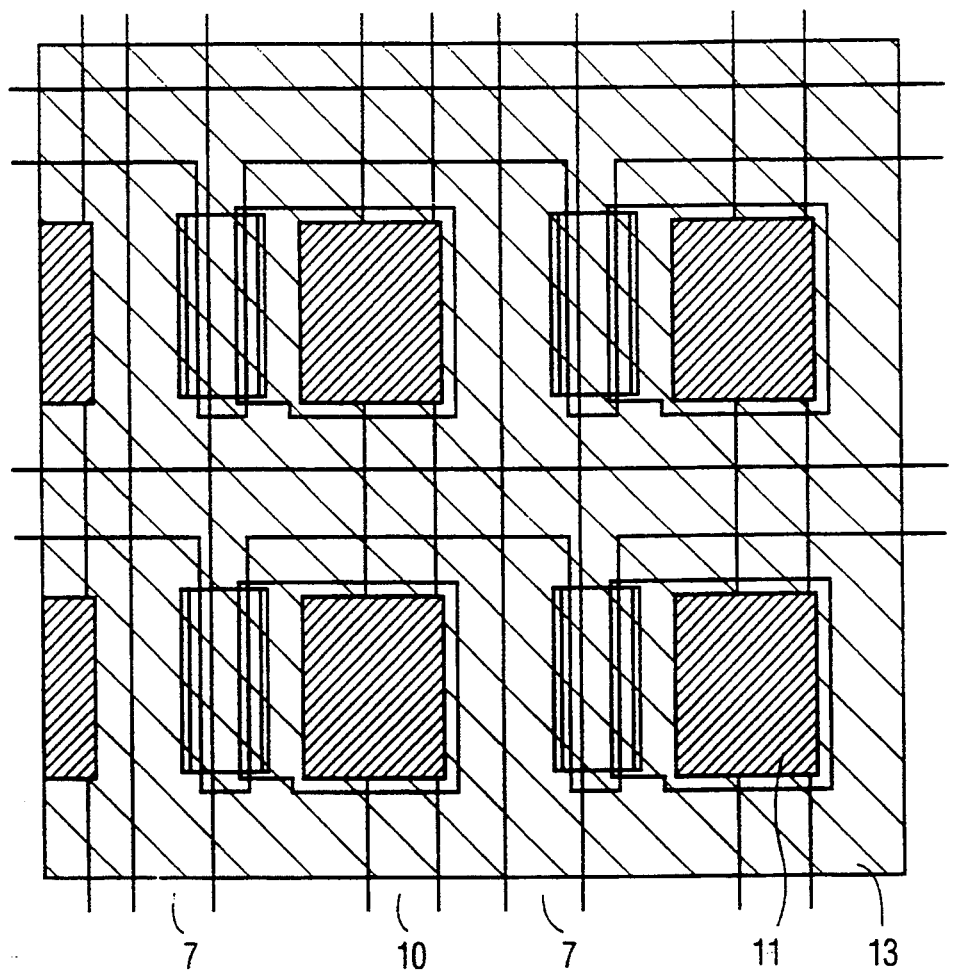
FIG. 5 shows a further embodiment of a detector in accordance with the invention in a plan view (FIG. 5a) and a cross-sectional view (FIG. 5b).
Figure 5B:
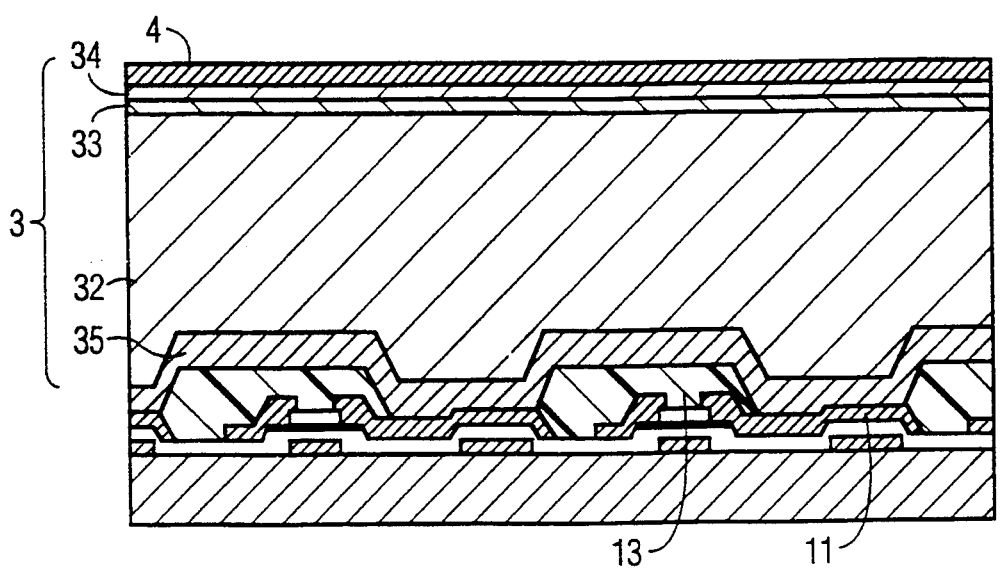

FIG. 5 shows a second embodiment of an image detector whose manufacture is simpler. Therein, the insulating layer 13 is formed so as to have a layer thickness (between 0.5 μm and at the most 2 μm) which is customary for a thin-film technique, a contact hole which extends as far as the collecting electrode 11 being provided above each of the collecting electrodes.

A feasible implementation will be described hereinafter with reference to the example of the photoconductor Se. Analogous structures can also be realized in other semiconductor materials, for example $HgI_2$, CdTe, CdSe or PbO. For the case that, contrary to the present example, a negative voltage is applied to the bias electrode so that negative charge carriers (electrons) migrate to the collecting electrode during X-ray exposure, the layers exhibiting suitable conductivity for positive charge carriers (holes) and poor conductivity for electrons are to be interchanged, and vice versa. On the insulating layer 13 there is provided a semiconductor layer 35 which does not conduct the negative charge carriers but which has a suitable conductivity for positive charge carriers. In the present example this layer is formed by a selenium layer which, like the layer 31, is doped with from 20 to 200 ppm Cl, but is thicker than the layer 31 of FIG. 3, for example from 5 to 40 μm. The description given with reference to FIG. 3 applies to the subsequent layers 32, 33, 34 and 4.

Figure 6:
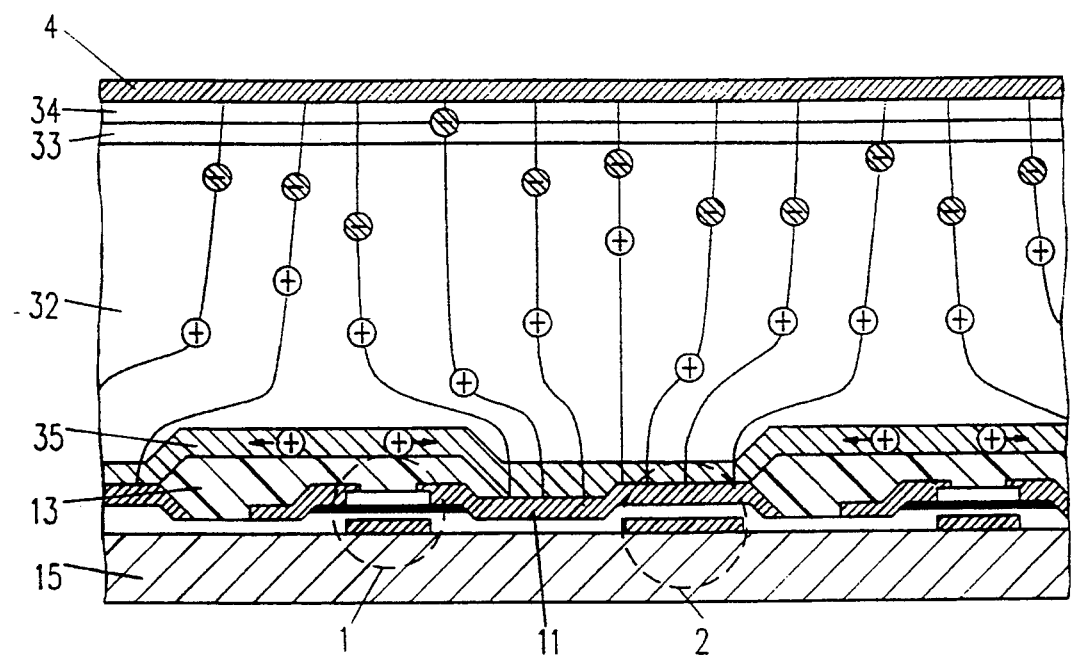
FIG. 6 shows the electric field lines in the embodiment shown in FIG. 5b.

The operation of this embodiment will be described in detail hereinafter with reference to FIG. 6. FIG. 6 corresponds to FIG. 5b, be it that the electric field lines or the paths of the electric charge carriers are also shown.

When a positive voltage of, for example 3 kV is applied to the bias electrode 4 and charge carriers are generated by X-ray exposure in the photoconductor layer 32, in this case consisting of, for example selenium doped with from 0.1 to 1% arsenic, positive space charges are formed above the areas passivated by the insulating layer 13. As is shown in FIG. 6, the electric field is distorted thereby. Because of the high conductivity of the layer 35 for holes, even charge carriers which have not been generated above the collecting electrode can reach the collecting electrode at a high speed in this layer. Electrons, if any, injected by the collecting electrodes 11 are retained in the layer 35; at this point the layer becomes analogous to the layer 31 of the FIGS. 3 and 4.

The high conductivity of the layer 35 for positive charge carriers, however, at the same time also means that the space charge in this layer is readily dispersed as shown in FIG. 6. As a result, in the state of equilibrium the desired field distortion will be comparatively small. Moreover, the field distortion can reach as far as into the actual photoconductor layer 32. The latter, however, has a low conductivity for the positive charge carriers, thus hampering the transport to the collecting electrode.

Figure 7:
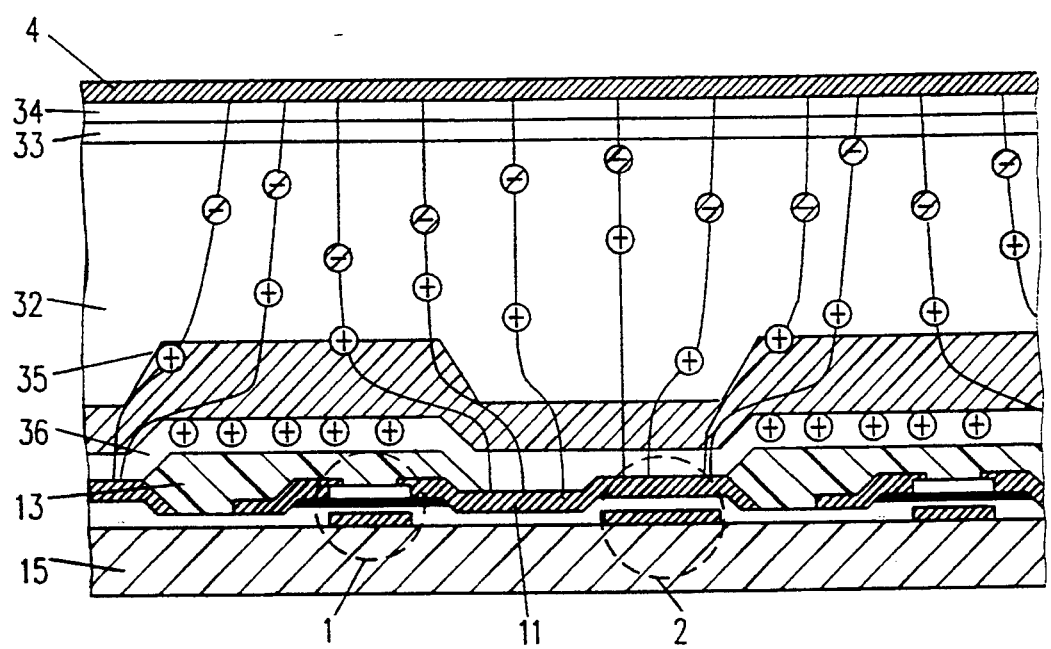
FIG. 7 shows an improved embodiment in a cross-sectional view.

FIG. 7 shows a further elaboration of this detector. Therein, underneath the layer which is suitably conductive for holes and poorly conductive for electrons there is provided a further semiconductor layer 36 which has approximately the same low conductivity for both polarities of charge carriers. In the present example, this layer has a thickness of approximately from 1 to 40 μm and consists of selenium doped with from 0.1 to 1% arsenic. Because of its low conductivity for positive charge carriers, the building-up of the space charge is more efficient because it cannot be dispersed parallel to the substrate. The field deflection is thus forced and will be located substantially in the layer 35 having a suitable conductivity for holes. The transfer of the charge carriers to the collecting electrode, now taking place mainly in the layer 35 which is suitably conductive for holes, is thus enabled, so that a maximum signal is obtained within a brief period of time. Electrons injected by the collecting electrodes are again retained in the layer 35. The fact that they have previously traversed the layer 36 does not affect the functionality of the detector.

Figure 8:
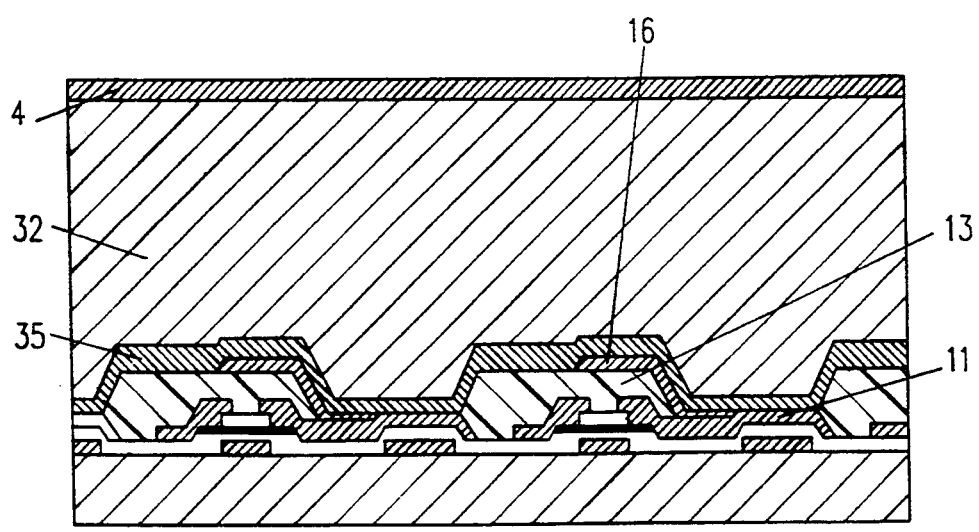
FIG. 8 shows an improved embodiment in a cross-sectional view.

In given circumstances the space charges in the semiconductor layer 35 above the thin-film transistors may have an effect on the function of these switching elements. In order to eliminate this effect, each of the collecting electrodes may comprise an additional electrode portion 16 which, as is shown in FIG. 8, overlaps the associated thin-film transistor above the insulating layer 13 and electrically contacts the electrode portion 11. These electrode portions are formed by metallization of the surface formed after deposition of the insulating layer and formation of the contact holes but before the deposition of the semiconductor layer 35.

We claim:

1. An X-ray image detector, comprising a plurality of X-ray sensitive sensors and having the following features:

each sensor comprises a collecting electrode (11), a reference electrode (10) and a switching element (1) which connects the collecting electrode to an output lead (7);

a photoconductor layer (3) is provided between the individual collecting electrodes (11) and a bias electrode (4); and in conjunction with the reference electrodes, the collecting electrodes form capacitances (2) which are chargeable by charge carriers generated in the photoconductor;

characterized in that each of the collecting electrodes comprises two electrically contacting electrode portions (11, 14), the first electrode portion (11) being arranged in a respective area adjoining the associated output lead (7), the second electrode portion (14) having a surface area which is greater than that of the first electrode portion and being situated between the first electrode portion and the bias electrode, an insulating layer being provided between the second electrode portion (14) and the output lead (7).

2. An X-ray image detector as claimed in claim 1, characterized in that the photoconductor layer (32) consists essentially of selenium.

3. An X-ray image detector as claimed in claim 1, characterized in that the photoconductor layer consists essentially of one of the substances PbO, CdTe, CdSe or HgI$_2$.

4. An X-ray image detector as claimed claim 1, characterized in that to both sides of the photoconductor layer (32) there are provided layers (31, 35; 33) which have a thickness which is small in comparison with that of the photoconductor layer (32), and which are doped so that their conductivity for the charge carriers flowing from the photoconductor to the neighboring electrodes (11; 4) is high in comparison with their conductivity for charge carriers of opposite polarity.

5. An X-ray image detector as claimed in claim 4, characterized in that between the bias electrode (4) and the neighboring layer (33) there is provided a layer (34) which is made of the same material as the photoconductor layer but which is substantially thinner than the latter layer.

6. An X-ray image detector as claimed in claim 1, characterized in that the insulating layer (13) consists of a plurality of insulating sub-layers (131, 132) which cover one another, each of the insulating sub-layers having apertures via which the two electrode portions (11, 14) contact one another, the apertures in each sub-layer becoming larger as the sub-layer is situated further from the first electrode portion (11).

7. An X-ray image detector as claimed in claim 6 wherein the insulating sub-layers consist of different materials.

8. An X-ray image detector, comprising a plurality of X-ray-sensitive sensors and having the following features:

each sensor comprises a collecting electrode (11), a reference electrode (10) and a switching element (1) which connects the collecting electrode to an output lead (7);

a photoconductor layer (3) is provided between the individual collecting electrodes (11) and a bias electrode (4); and in conjunction with the reference electrodes, the collecting electrodes form capacitances (2) which can be charged by charge carriers generated in the photoconductor;

characterized in that each sensor also has the following features:

the collecting electrode (11) is arranged adjacent the output lead (7);

the switching element (1) and the output lead are covered by an insulating layer (13);

the insulating layer (13) and the collecting electrode (11) are covered by a semiconductor layer (35); and the semiconductor layer (35) is doped so that for the charge carriers flowing in the direction of the collecting electrode it has a conductivity which is high in comparison with its conductivity for charge carriers of opposite polarity.

9. An X-ray image detector as claimed in claim 8, characterized in that between the semiconductor layer (35) and the collecting electrodes (11) there is provided an additional semiconductor layer (36) which has a low conductivity for positive as well as negative charge carriers.

10. An X-ray image detector as claimed in claim 8, characterized in that each of the collecting electrodes (11, 16) consists of two electrode portions which electrically contact one another, the first electrode portion being arranged at the area adjacent the output lead, the second electrode (16) being situated on the insulating layer above the associated switching element (1) and itself being covered by the semiconductor layer (35).

11. An X-ray image detector as claimed in claim 8 characterized in that the photoconductor layer (32) consists essentially of selenium.

12. An X-ray image detector as claimed in claim 8 characterized in that the photoconductor layer consists essentially of one of the substances PbO, CdTe, CdSe or $HgI_2$.

13. An X-ray image detector as claimed in claim 8 characterized in that to both sides of the photoconductor layer (32) there are provided layers (31, 35; 33) which have a thickness which is small in comparison with that of the photoconductor layer (32), and which are doped so that their conductivity for the charge carriers flowing from the photoconductor to the neighboring electrodes (11; 4) is high in comparison with their conductivity for charge carriers of opposite polarity.

* * * * *